(12) United States Patent
Tseng et al.

(10) Patent No.: US 10,467,957 B2
(45) Date of Patent: Nov. 5, 2019

(54) TRANSMITTING CONTROL LINE DRIVER, OLED PANEL HAVING SAME, AND DISPLAY DEVICE

(71) Applicant: EverDisplay Optronics (Shanghai) Limited, Shanghai (CN)

(72) Inventors: Ying-Hsiang Tseng, Shanghai (CN); Lina Xiao, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 96 days.

(21) Appl. No.: 15/562,930

(22) PCT Filed: Mar. 31, 2015

(86) PCT No.: PCT/CN2015/075547
§ 371 (c)(1),
(2) Date: Sep. 29, 2017

(87) PCT Pub. No.: WO2016/154909
PCT Pub. Date: Oct. 6, 2016

(65) Prior Publication Data
US 2018/0090065 A1    Mar. 29, 2018

(51) Int. Cl.
*G09G 3/3233*    (2016.01)
*G11C 8/08*    (2006.01)
(Continued)

(52) U.S. Cl.
CPC ......... *G09G 3/3233* (2013.01); *G09G 3/3266* (2013.01); *G11C 8/08* (2013.01); *G11C 19/28* (2013.01); *G09G 2310/06* (2013.01)

(58) Field of Classification Search
None
See application file for complete search history.

(56) References Cited

U.S. PATENT DOCUMENTS

| 2010/0013824 A1 | 1/2010 | Kim |
| 2010/0207968 A1 | 8/2010 | Kim |
| 2014/0132162 A1 | 5/2014 | Kim |

FOREIGN PATENT DOCUMENTS

| CN | 1525643 A | 9/2004 |
| CN | 101256735 A | 9/2008 |

(Continued)

OTHER PUBLICATIONS

PCT Search Report dated Dec 21, 2015 by the WIPO Office.

*Primary Examiner* — Kenneth Bukowski
*Assistant Examiner* — Donna V Lui
(74) *Attorney, Agent, or Firm* — Yunling Ren

(57) ABSTRACT

A transmitting control line driver, an OLED panel having same, and a display device. The transmitting control line driver comprises multiple stages of transmitting control line driver units. A first time sequence signal transmission line (Ck1) is coupled to first input ends (CKE1) in odd stages of the transmitting control line driver units and second input ends (CKE2) in even stages of the transmitting control line driver units. A second time sequence signal transmission line (CK2) is coupled to second input ends (CKE2) in the odd stages of the transmitting control line driver units and first input ends (CKE1) in the even stages of the transmitting control line driver units. A signal output end (out) of each stage of a transmitting control line driver unit is coupled to a third input end (in) of a subsequent stage of the transmitting control line driver unit.

20 Claims, 11 Drawing Sheets

(51) Int. Cl.
   *G09G 3/3266*     (2016.01)
   *G11C 19/28*      (2006.01)

(56) References Cited

FOREIGN PATENT DOCUMENTS

| | | |
|---|---|---|
| CN | 101527110 A | 9/2009 |
| CN | 102148009 A | 8/2011 |
| CN | 103295522 A | 9/2013 |
| KR | 20140050197 A | 4/2014 |

TRANSMITTING CONTROL LINE DRIVER, OLED PANEL HAVING SAME, AND DISPLAY DEVICE

CROSS REFERENCE

The present application is a continuing application of International Application No. PCT/CN2015/075547, filed on Mar. 31, 2015, and the entire contents thereof are incorporated herein by reference.

TECHNICAL FIELD

Embodiments of the present disclosure relate to technical filed of control circuit for display device, particularly to a transmitting control line driver using two driving signals, an OLED panel comprising the same, and a display device.

BACKGROUND

Recently, various flat panel displays (FPDs) with smaller weight and size as compared to cathode-ray tube (CRT) display have been developed, including liquid crystal display, field emission display, plasma display panel and organic light-emitting display.

As a flat panel display, the organic light-emitting display displays images by using organic light-emitting diodes (OLEDs) which emit light by means of recombination of electrons and holes. The organic light-emitting display has a relatively higher response speed and is driven at relatively lower power. A typical organic light-emitting device supplies the OLEDs with current according to data signals by utilizing transistors formed in pixels, so that the OLEDs emit light.

The typical organic light-emitting display includes: a data driver supplying data lines with data signals, a scan driver supplying scan lines with scan signals sequentially, a transmitting control line driver supplying transmitting control lines with transmitting control signals, and a display unit including a plurality of pixels coupled to the data lines, the scan lines and the transmitting control lines.

When the scan signal is supplied to the scan line, the pixel included in the display unit is selected to receive the data signal from the data line. The pixel receiving the data line signal generates light with brightness (e.g., predetermined brightness) based on the data signal and displays a predetermined image. Herein, a transmitting time of the pixel is controlled by the transmitting control signal provided by the transmitting control line. Generally, the transmitting control signal is supplied to be overlapped with the scan signal which is supplied to one or two scan line, so as to configure the pixel supplied with the data line to be at a non-transmitting state.

The transmitting control line driver includes stages coupled to the transmitting control lines. These stages receive at least four signals, and output high voltage or low voltage to output lines.

However, the stages included in a typical transmitting control line driver are driven by at least four signals. As illustrated in FIG. 1 and FIG. 2, a circuit of a transmitting control line driver unit of the typical transmitting control line driver includes eleven transistors and two capacitors, and requires at least four signals clk1, clk1$b$, sp and rs; as a result, the circuit has an extremely complex structure, which increases the cost and makes it difficult to ensure the driving reliability.

The foregoing information disclosed in the BACKGROUND part is merely set forth for facilitating those skilled in the art to understand the background technology of the present disclosure, and hence may contain some information which is unknown to those skilled in the art of this country and doesn't constitute the prior art.

SUMMARY

In view of the defects existed in the prior art, the present disclosure provides a transmitting control line driver and a display device comprising the transmitting control line driver, which overcome the problems in the prior art by modifying the traditional four driving signals to two driving signals without increasing components or elements; in this way, the same function is achieved by using less control signal; the reduce of the control signal can save the area of the circuit diagram, decrease the area of the integrated circuit and also the number of the combined regions, so as to improve the reliability and allow wider operation space for components.

According to one aspect of the present disclosure, a transmitting control line driver is provided, including multiple stages of transmitting control line driver units, a single-pulse activating signal transmission line, a first time sequence signal transmission line and a second time sequence signal transmission line.

Each stage of a transmitting control line driver unit includes:

A first transistor coupled between a first input terminal and a first node, the first transistor having a gate electrode coupled to a third input terminal;

A second transistor coupled between the first node and a first power supply voltage, the second transistor having a gate electrode coupled to the first input terminal;

A third transistor coupled between a second input terminal and a second node, the third transistor having a gate electrode coupled to the second input terminal;

A fourth transistor coupled between the second node and a third node, the fourth transistor having a gate electrode coupled to the first node;

A fifth transistor coupled between a fourth node and the third input terminal, the fifth transistor having a gate electrode coupled to the second input terminal;

A sixth transistor coupled between a second power supply voltage and the third node, the six transistor having a gate electrode coupled to the fourth node;

A seventh transistor coupled between the second power supply voltage and the fourth node, the seventh transistor having a gate electrode coupled to the third node;

An eighth transistor coupled between the second power supply voltage and a fifth node, the eighth transistor having a gate electrode coupled to the fourth node;

A ninth transistor coupled between the fifth node and the first power supply voltage, the ninth transistor having a gate electrode coupled to the third node;

A tenth transistor coupled between the second power supply voltage and a signal output terminal, the tenth transistor having a gate electrode coupled to the fifth node;

An eleventh transistor coupled between the signal output terminal and the first power supply voltage, the eleventh transistor having a gate electrode coupled to the fourth node;

A first capacitor coupled between the second power supply voltage and the fifth node; and A second capacitor coupled to the fourth node and the first input terminal.

The signal output terminal of each stage of the transmitting control line driver unit is coupled to the third input terminal of a next stage of the transmitting control line driver unit.

The third input terminal of a first stage of the transmitting control line driver unit is coupled to the single-pulse activating signal transmission line.

The first time sequence signal transmission line is coupled to first input terminals of odd number stages of the transmitting control line driver units and is coupled to second input terminals of even number stages of the transmitting control line driver units.

The second time sequence signal transmission line is coupled to second input terminals of the odd number stages of the transmitting control line driver units and is coupled to first input terminals of the even number stages of the transmitting control line driver units.

The signal output terminal of each stage of the transmitting control line driver unit is coupled to the third input terminal of a next stage of the transmitting control line driver unit, respectively.

Preferably, the first transistor, the second transistor, the third transistor, the fourth transistor, the fifth transistor, the sixth transistor, the seventh transistor, the eighth transistor, the ninth transistor, the tenth transistor and the eleventh transistor are all PMOS transistors.

Preferably, the first time sequence signal transmission line is configured to transmit a first clock pulse signal; the second time sequence signal transmission line is configured to transmit a second clock pulse signal; and the first clock pulse signal and the second clock pulse signal are not overlapped with each other.

Preferably, the second clock pulse signal is a half-period delay signal of the first clock pulse signal.

Preferably, the third input terminal of the first stage of the transmitting control line driver unit is configured to receive a single-pulse activating signal.

Preferably, the signal output terminal of each stage of the transmitting control line driver unit is further coupled to a transmitting control line.

According to another aspect of the present disclosure, an OLED panel is provided, the OLED panel including a signal controller, a data driver, a scan driver, a plurality of OLED pixels and the transmitting control line driver as mentioned above. The transmitting control line driver includes multiple stages of transmitting control line driver units, a single-pulse activating signal transmission line, a first time sequence signal transmission line and a second time sequence signal transmission line.

Each stage of a transmitting control line driver unit includes:

A first transistor coupled between a first input terminal and a first node, the first transistor having a gate electrode coupled to a third input terminal;

A second transistor coupled between the first node and a first power supply voltage, the second transistor having a gate electrode coupled to the first input terminal;

A third transistor coupled between a second input terminal and a second node, the third transistor having a gate electrode coupled to the second input terminal;

A fourth transistor coupled between the second node and a third node, the fourth transistor having a gate electrode coupled to the first node;

A fifth transistor coupled between a fourth node and the third input terminal, the fifth transistor having a gate electrode coupled to the second input terminal;

A sixth transistor coupled between a second power supply voltage and the third node, the six transistor having a gate electrode coupled to the fourth node;

A seventh transistor coupled between the second power supply voltage and the fourth node, the seventh transistor having a gate electrode coupled to the third node;

An eighth transistor coupled between the second power supply voltage and a fifth node, the eighth transistor having a gate electrode coupled to the fourth node;

A ninth transistor coupled between the fifth node and the first power supply voltage, the ninth transistor having a gate electrode coupled to the third node;

A tenth transistor coupled between the second power supply voltage and a signal output terminal, the tenth transistor having a gate electrode coupled to the fifth node;

An eleventh transistor coupled between the signal output terminal and the first power supply voltage, the eleventh transistor having a gate electrode coupled to the fourth node;

A first capacitor coupled between the second power supply voltage and the fifth node; and A second capacitor coupled to the fourth node and the first input terminal.

The signal output terminal of each stage of the transmitting control line driver unit is coupled to a third input terminal of a next stage of the transmitting control line driver unit, respectively.

The third input terminal of the first stage of the transmitting control line driver unit is coupled to the single-pulse activating signal transmission line.

The first time sequence signal transmission line is coupled to first input terminals of odd number stages of the transmitting control line driver units and is coupled to second input terminals of even number stages of the transmitting control line driver units.

The second time sequence signal transmission line is coupled to second input terminals of the odd number stages of the transmitting control line driver units and is coupled to first input terminals of the even number stages of the transmitting control line driver units.

The signal output terminal of each stage of the transmitting control line driver unit is coupled to the third input terminal of a next stage of the transmitting control line driver unit.

Preferably, the first transistor, the second transistor, the third transistor, the fourth transistor, the fifth transistor, the sixth transistor, the seventh transistor, the eighth transistor, the ninth transistor, the tenth transistor, and the eleventh transistor are all PMOS transistors.

Preferably, the first time sequence signal transmission line is configured to transmit a first clock pulse signal; the second time sequence signal transmission line is configured to transmit a second clock pulse signal; and the first clock pulse signal and the second clock pulse signal are not overlapped with each other.

Preferably, the second clock pulse signal is a half-period delay signal of the first clock pulse signal.

Preferably, the third input terminal of the first stage of the transmitting control line driver unit is configured to receive a single-pulse activating signal.

Preferably, the signal output terminal of each stage of the transmitting control line driver unit is further coupled to a transmitting control line.

According to yet another aspect of the present disclosure, a display device is further provided, including a signal controller, a data driver, a scan driver, a plurality of OLED pixels and the transmitting control line driver as mentioned above. The transmitting control line driver includes multiple stages of transmitting control line driver units, a single-pulse activating signal transmission line, a first time sequence signal transmission line and a second time sequence signal transmission line.

Each stage of a transmitting control line driver unit includes:

A first transistor coupled between a first input terminal and a first node, the first transistor having a gate electrode coupled to a third input terminal;

A second transistor coupled between the first node and a first power supply voltage, the second transistor having a gate electrode coupled to the first input terminal;

A third transistor coupled between a second input terminal and a second node, the third transistor having a gate electrode coupled to the second input terminal;

A fourth transistor coupled between the second node and a third node, the fourth transistor having a gate electrode coupled to the first node;

A fifth transistor coupled between a fourth node and the third input terminal, the fifth transistor having a gate electrode coupled to the second input terminal;

A sixth transistor coupled between a second power supply voltage and the third node, the six transistor having a gate electrode coupled to the fourth node;

A seventh transistor coupled between the second power supply voltage and the fourth node, the seventh transistor having a gate electrode coupled to the third node;

An eighth transistor coupled between the second power supply voltage and a fifth node, the eighth transistor having a gate electrode coupled to the fourth node;

A ninth transistor coupled between the fifth node and the first power supply voltage, the ninth transistor having a gate electrode coupled to the third node;

A tenth transistor coupled between the second power supply voltage and a signal output terminal, the tenth transistor having a gate electrode coupled to the fifth node;

An eleventh transistor coupled between the signal output terminal and the first power supply voltage, the eleventh transistor having a gate electrode coupled to the fourth node;

A first capacitor coupled between the second power supply voltage and the fifth node; and A second capacitor coupled to the fourth node and the first input terminal.

The signal output terminal of each stage of the transmitting control line driver unit is coupled to a third input terminal of a next stage of the transmitting control line driver unit, respectively.

The third input terminal of the first stage of the transmitting control line driver unit is coupled to the single-pulse activating signal transmission line.

The first time sequence signal transmission line is coupled to first input terminals of odd number stages of the transmitting control line driver units and is coupled to second input terminals of even number stages of the transmitting control line driver units.

The second time sequence signal transmission line is coupled to second input terminals of the odd number stages of the transmitting control line driver units and is coupled to first input terminals of the even number stages of the transmitting control line driver units.

The signal output terminal of each stage of the transmitting control line driver unit is coupled to the third input terminal of a next stage of the transmitting control line driver unit, respectively.

Preferably, the first transistor, the second transistor, the third transistor, the fourth transistor, the fifth transistor, the sixth transistor, the seventh transistor, the eighth transistor, the ninth transistor, the tenth transistor, and the eleventh transistor are all PMOS transistors.

Preferably, the first time sequence signal transmission line is configured to transmit a first clock pulse signal; the second time sequence signal transmission line is configured to transmit a second clock pulse signal; and the first clock pulse signal and the second clock pulse signal are not overlapped with each other.

Preferably, the second clock pulse signal is a half-period delay signal of the first clock pulse signal.

Preferably, the third input terminal of the first stage of the transmitting control line driver unit is configured to receive a single-pulse activating signal.

Preferably, the signal output terminal of each stage of the transmitting control line driver unit is further coupled to a transmitting control line.

By virtue of utilizing the above-mentioned technical solutions, as compared with related technology, in the transmitting control line driver of the present disclosure, the traditional four driving signals are reduced to two driving signals without increasing components or elements. In this way, the same function is achieved by using less control signals; with the reduce of the control signals, the area of the circuit diagram is saved, the area of the integrated circuit is decreased and also the number of the combined regions is decreased, the reliability is improved, and wider operating spaces for components is allowed.

BRIEF DESCRIPTION OF THE DRAWINGS

Other features, objective and advantageous of the present disclosure will be more apparent from the flowing detailed description with reference to the drawings, in which.

DETAILED DESCRIPTION

Figure 1:
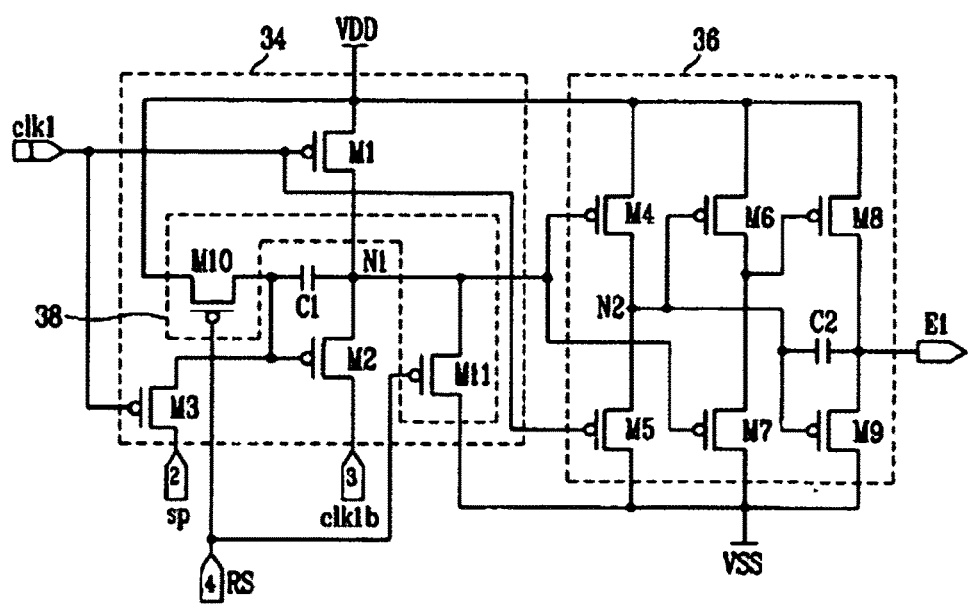
FIG. 1 illustrates a circuit diagram of a transmitting control line driver unit in a transmitting control line driver provided in the prior art.
Figure 2:
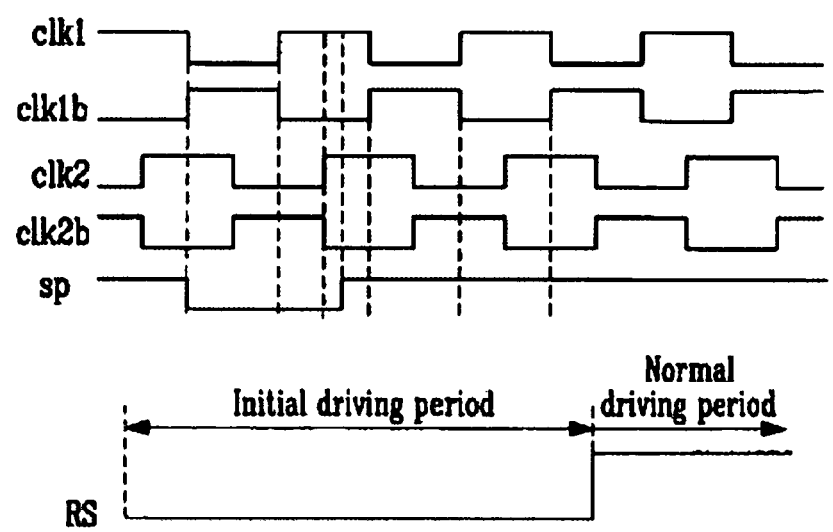
FIG. 2 illustrates an input pulse waveform diagram corresponding to the transmitting control line driver unit in the transmitting control line driver provided in the prior art.

Those skilled in the art should be understood that modified examples may be obtained by combining prior art with the foregoing embodiments, and hence will not be described in details herein. These modified examples will not affect the substantive contents of the present disclosure, with details thereof omitted herein.

Hereinafter the illustrative embodiments will be described more completely. However, these embodiments may be implemented by various ways and should not be construed to be limited to the implementations set forth herein. More accurately, these implementations are provided for purpose of sufficiency and completeness of the contents disclosed by the present disclosure, so that the scope of protection of the present disclosure can be well conveyed to those ordinary skilled in the art.

For purpose of clarity, dimensions of layers and regions in the drawings may be exaggerated. Similar reference numerals throughout the specification indicate similar elements.

It should be understood that, although terms such as "first", "second" and "third" are used to describe various elements, these elements should not be interpreted to be limited to these terms. The above-mentioned terms are merely used for distinguishing an element from another one. Therefore, as discussed hereinafter, a "first element" may be referred to as a "second element" without departing from the technical teaching of the present disclosure. As used herein, the term "and/or" includes any or all combination of one or more correlated items as listed.

The terms are used herein merely for purpose of describing particular illustrative embodiments but not limiting the inventive concept of the present disclosure. As used in the present disclosure, "a" and "an" in singular forms should also include meanings of plural forms, unless otherwise defined. It should also be appreciated that, as used in the specification, terms "comprising" and/or "including" specifies the presence of a feature, an integer, a step, an operation, an element and/or a component, without excluding the presence or addition of one or more other feature, integer, step, operation, element, component and/or combination thereof.

Unless defined oppositely, all terms (including technical terms and scientific terms) as used herein should be interpreted identically with those generally understood by one ordinary skilled in the art. It should also be appreciated that, the terms as defined in, for example, a publically used dictionary, should be interpreted to have meanings consistent with that in the context of related fields, and shall not be interpreted ideally or excessively literally, unless definitely specified so in the present disclosure.

First Embodiment

Figure 3:
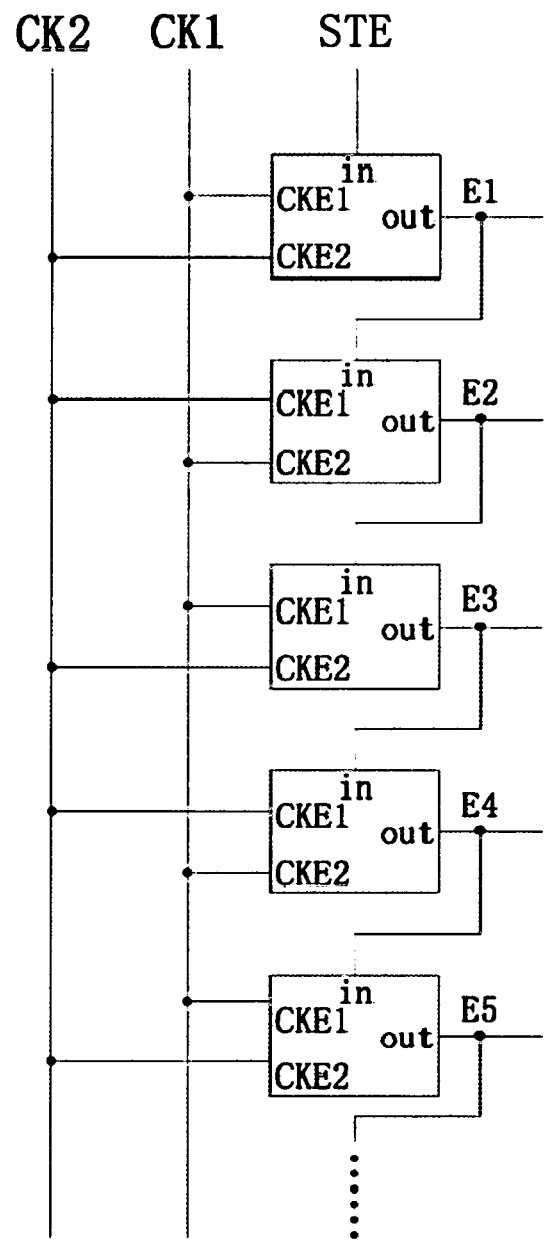
FIG. 3 illustrates a circuit diagram of a transmitting control line driver of the present disclosure, according to a first embodiment of the present disclosure.
Figure 4:
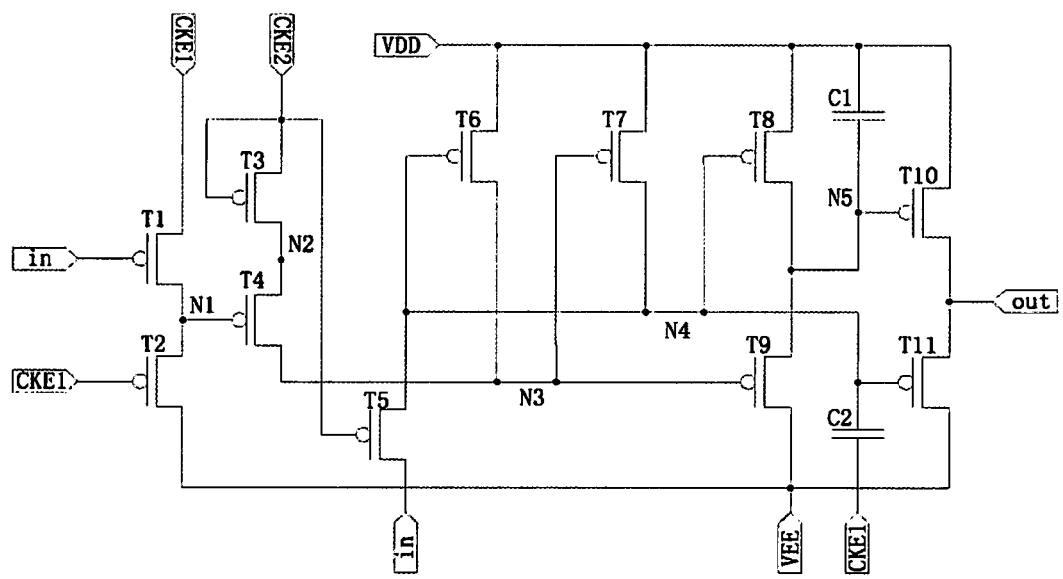
FIG. 4 illustrates a circuit diagram of a transmitting control line driver unit in the transmitting control line driver of the present disclosure, according to the first embodiment of the present disclosure.

As illustrated in FIG. 3 and FIG. 4, the transmitting control line driver of the present disclosure includes multiple stages of transmitting control line driver units (the present embodiment only illustrates a first stage of the transmitting control line driver unit E1 through a fifth stage of the transmitting control line driver unit E5, without limiting the embodiments thereto); and the transmitting control line driver is controlled by a single-pulse activating signal transmission line STE, a first time sequence signal transmission line CK1 and a second time sequence signal transmission line CK2. A third input terminal in of the first stage of the transmitting control line driver unit is coupled to the single-pulse activating signal transmission line.

Each stage of the transmitting control line driver unit includes first through eleventh p-channel metal oxide semiconductor (PMOS) transistors T1-T11, as well as a first capacitor C1 and a second capacitor C2.

The first PMOS transistor T1 is coupled between a first input terminal CKE1 and a first node N1, and the first PMOS transistor T1 has a gate electrode coupled to a third input terminal "in". The second PMOS transistor T2 is coupled between the first node N1 and a first power supply voltage VEE, and the second PMOS transistor T2 has a gate electrode coupled to the first input terminal CKE1. The third PMOS transistor T3 is coupled between a second input terminal CKE2 and a second node N2, and the third PMOS transistor T3 has a gate electrode coupled to the second input terminal CKE2. The fourth PMOS transistor T4 is coupled between the second node N2 and a third node N3, and the fourth PMOS transistor T4 has a gate electrode coupled to the first node N1. The fifth PMOS transistor T5 is coupled between a fourth node N4 and the third input terminal "in", and the fifth PMOS transistor T5 has a gate electrode coupled to the second input terminal CKE2. The sixth PMOS transistor T6 is coupled between a second power supply voltage VDD and the third node N3, and the sixth PMOS transistor T6 has a gate electrode coupled to the fourth node N4. The seventh PMOS transistor T7 is coupled between the second power supply voltage VDD and the fourth node N4, and the seventh PMOS transistor T7 has a gate electrode coupled to the third node N3. The eighth PMOS transistor T8 is coupled between the second power supply voltage VDD and a fifth node N5, and the eighth PMOS transistor T8 has a gate electrode coupled to the fourth node N4. The ninth PMOS transistor T9 is coupled between the fifth node N5 and the first power supply voltage VEE, and the ninth PMOS transistor T9 has a gate electrode coupled to the third node N3. The tenth PMOS transistor T10 is coupled between the second power supply voltage VDD and a signal output terminal "out", and the tenth PMOS transistor T10 has a gate electrode coupled to the fifth node N5. The eleventh PMOS transistor T11 is coupled between the signal output terminal "out" and the first power supply voltage VEE, and the eleventh PMOS transistor T11 has a gate electrode coupled to the fourth node N4. The first capacitor C1 is coupled between the second power supply voltage VDD and the fifth node N5. The second capacitor C2 is coupled to the fourth node N4 and the first input terminal CKE1. The signal output terminal "out" of each stage of the transmitting control line driver unit is coupled to the third input terminal "in" of a next stage of the transmitting control line driver unit, respectively. Moreover, the signal output terminal "out" of each stage of the transmitting control line driver unit is further coupled to a transmitting control line.

The first time sequence signal transmission line CK1 is coupled to first input terminals CKE1 of odd number stages of the transmitting control line driver units and is coupled to second input terminals CKE2 of even number stages of the transmitting control line driver units. The second time sequence signal transmission line CK2 is coupled to second input terminals CKE2 of the odd number stages of the transmitting control line driver units and is coupled to first input terminals CKE1 of the even number stages of the transmitting control line driver units. The signal output terminal "out" of each stage of the transmitting control line driver unit is coupled to the third input terminal "in" of a next stage of the transmitting control line driver unit.

In the present embodiment, the first time sequence signal transmission line CK1 is configured to transmit a first clock pulse signal, the second time sequence signal transmission line CK2 is configured to transmit a second clock pulse signal, and the first clock pulse signal and the second clock pulse signal are not overlapped with each other, without limiting the embodiments thereto.

According to the connecting methods of the transmitting control line driver units, the first input terminal CKE1 of the odd number stage of the transmitting control line driver unit is configured to receive the first clock pulse signal, and the second input terminal CKE2 of the odd number stage of the transmitting control line driver unit is configured to receive the second clock pulse signal; the first input terminal CKE1 of the even number stage of the transmitting control line driver unit is configured to receive the second clock pulse signal, and the second input terminal CKE2 of the odd number stage of the transmitting control line driver unit is configured to receive the first clock pulse signal.

In the present embodiment, the first node N1, the second node N2, the third node N3, the fourth node N4 and the fifth node N5 are not real elements but virtual connecting nodes between components and elements. The first node N1 is a connecting node between the first PMOS transistor T1 and the second PMOS transistor T2. The second node N2 is a connecting node between the third PMOS transistor T3 and the fourth PMOS transistor T4. The third node N3 is a connecting node respectively connecting to the gate electrode of the fourth PMOS transistor T4, the gate electrode of the sixth PMOS transistor T6, the gate electrode of the seventh PMOS transistor T7 and the gate electrode of the ninth PMOS transistor T9. The fourth node N4 is a connecting node respectively connecting to the gate electrode of the fifth PMOS transistor T5, the gate electrode of the sixth PMOS transistor T6, the gate electrode of the seventh PMOS transistor T7, the gate electrode of the eighth PMOS transistor T8, the gate electrode of the eleventh PMOS transistor T11 and the second capacitor C2. The fifth node N5 is a connecting node respectively connecting to the gate electrode of the eighth PMOS transistor T8, the gate electrode of the ninth PMOS transistor T9, the gate electrode of the tenth PMOS transistor T10 and the first capacitor C1.

Hereinafter, particular circuit-conducted states and corresponding pulse waveform diagrams of the first stage of the transmitting control line driver unit, at a first moment through a fifth moment, in the transmitting control line driver of the present disclosure are exhibited through FIGS. 5-10.

Figure 5:
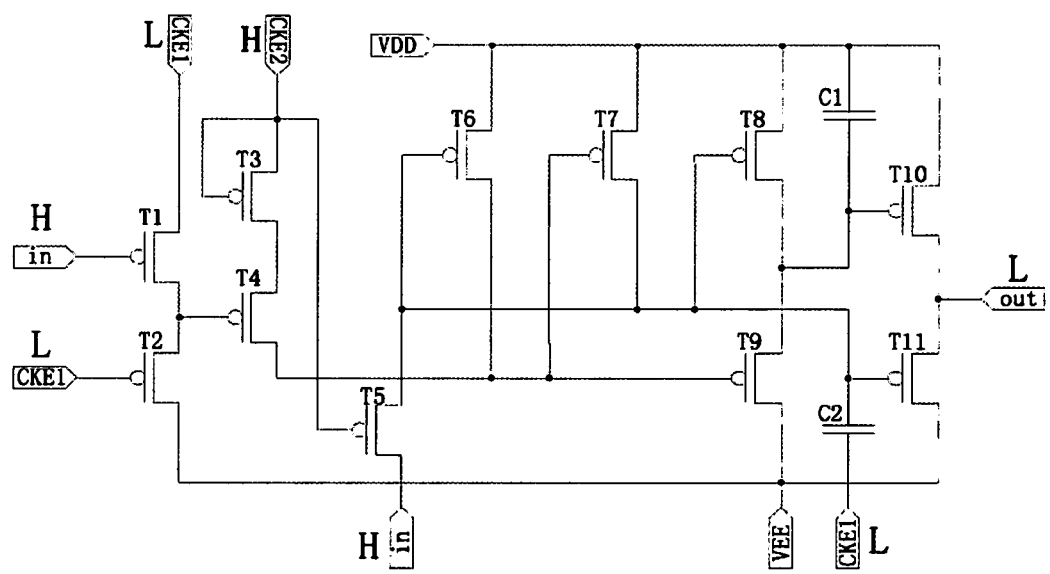
FIG. 5 illustrates a schematic diagram illustrating a circuit-conducted state of a first stage of the transmitting control line driver unit, at a first moment, in the transmitting control line driver of the present disclosure, according to the first embodiment of the present disclosure.

As illustrated in FIG. 5, at a first moment (corresponding to region "A" of FIG. 10) of the first stage of the transmitting control line driver unit in the transmitting control line driver of the present disclosure, the first input terminal CKE1 is input with a low level, the second input terminal CKE2 is input with a high level, and the third input terminal "in" is input with a high level. Then, the first PMOS transistor T1 is cut-off; the second PMOS transistor T2 is conducted; the third PMOS transistor T3 is cut-off; the fourth PMOS transistor T4 is conducted; the fifth PMOS transistor T5 is cut-off; the sixth PMOS transistor T6 is conducted; the seventh PMOS transistor T7 is cut-off; the eighth PMOS transistor T8 is conducted; the ninth PMOS transistor T9 is cut-off; the tenth PMOS transistor T10 is cut-off; the eleventh PMOS transistor P11 is conducted; and finally, the signal output terminal "out" outputs a low level.

Figure 6:
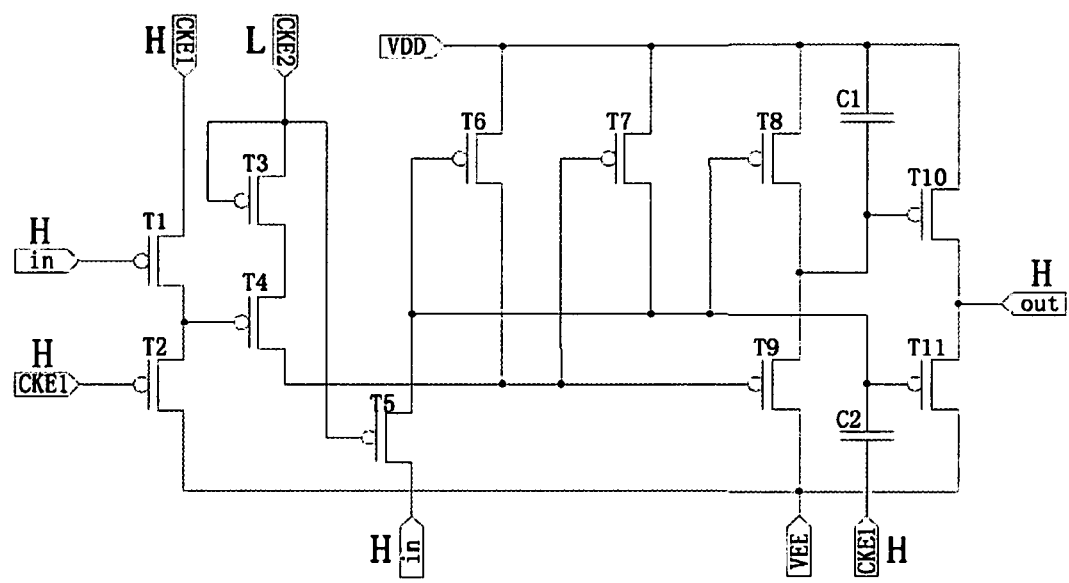
FIG. 6 illustrates a schematic diagram illustrating a circuit-conducted state of the first stage of the transmitting control line driver unit, at a second moment, in the transmitting control line driver of the present disclosure, according to the first embodiment of the present disclosure.

As illustrated in FIG. 6, at a second moment (corresponding to region "B" of FIG. 10) of the first stage of the transmitting control line driver unit in the transmitting control line driver of the present disclosure, the first input terminal CKE1 is input with a high level, the second input terminal CKE2 is input with a low level, and the third input terminal "in" is input with a high level. Then, the first PMOS transistor T1 is cut-off; the second PMOS transistor T2 is cut-off; the third PMOS transistor T3 is conducted; the fourth PMOS transistor T4 is conducted; the fifth PMOS transistor T5 is conducted; the sixth PMOS transistor T6 is cut-off; the seventh PMOS transistor T7 is conducted; the eighth PMOS transistor T8 is cut-off; the ninth PMOS transistor T9 is conducted; the tenth PMOS transistor T10 is conducted; the eleventh PMOS transistor P11 is cut-off; and finally, the signal output terminal out outputs a high level.

Figure 7:
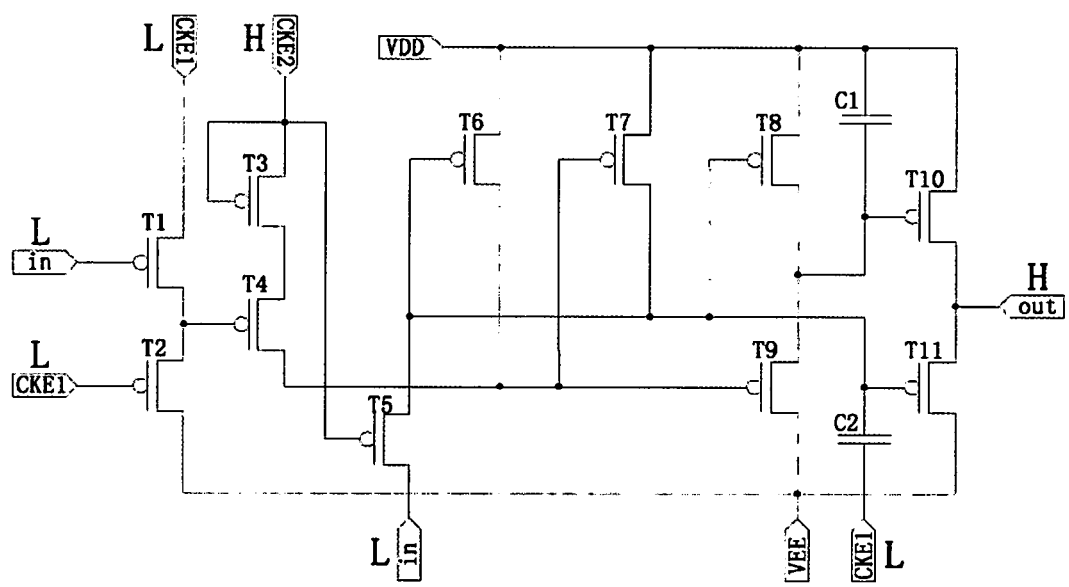
FIG. 7 illustrates a schematic diagram illustrating a circuit-conducted state of the first stage of the transmitting control line driver unit, at a third moment, in the transmitting control line driver of the present disclosure, according to the first embodiment of the present disclosure.

As illustrated in FIG. 7, at a third moment (corresponding to region "C" of FIG. 10) of the first stage of the transmitting control line driver unit in the transmitting control line driver of the present disclosure, the first input terminal CKE1 is input with a low level, the second input terminal CKE2 is input with a high level, and the third input terminal "in" is input with a low level. Then, the first PMOS transistor T1 is conducted; the second PMOS transistor T2 is conducted; the third PMOS transistor T3 is cut-off; the fourth PMOS transistor T4 is conducted; the fifth PMOS transistor T5 is cut-off; the sixth PMOS transistor T6 is cut-off; the seventh PMOS transistor T7 is conducted; the eighth PMOS transistor T8 is cut-off; the ninth PMOS transistor T9 is conducted; the tenth PMOS transistor T10 is conducted; the eleventh PMOS transistor P11 is cut-off; and finally, the signal output terminal "out" outputs a high level.

Figure 8:
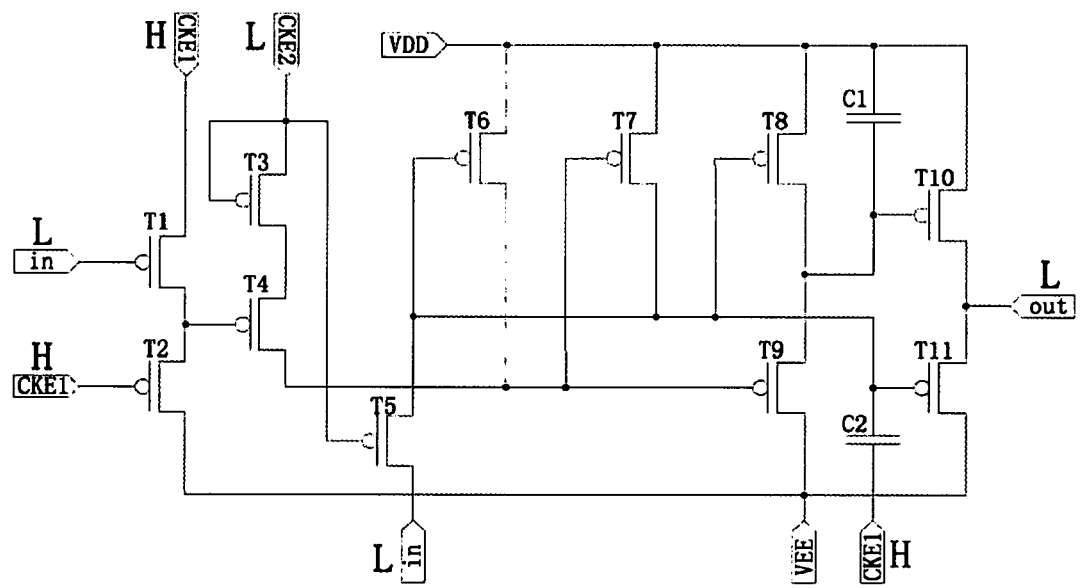
FIG. 8 illustrates a schematic diagram illustrating a circuit-conducted state of the first stage of the transmitting control line driver unit, at a fourth moment, in the transmitting control line driver of the present disclosure, according to the first embodiment of the present disclosure.

As illustrated in FIG. 8, at a fourth moment (corresponding to region "D" of FIG. 10) of the first stage of the transmitting control line driver unit in the transmitting control line driver of the present disclosure, the first input terminal CKE1 is input with a high level, the second input terminal CKE2 is input with a low level, and the third input terminal "in" is input with a low level. Then, the first PMOS transistor T1 is conducted; the second PMOS transistor T2 is cut-off; the third PMOS transistor T3 is conducted; the fourth PMOS transistor T4 is cut-off; the fifth PMOS transistor T5 is conducted; the sixth PMOS transistor T6 is conducted; the seventh PMOS transistor T7 is cut-off; the eighth PMOS transistor T8 is conducted; the ninth PMOS transistor T9 is cut-off; the tenth PMOS transistor T10 is cut-off; the eleventh PMOS transistor P11 is conducted; and finally, the signal output terminal "out" outputs a low level.

Figure 9:
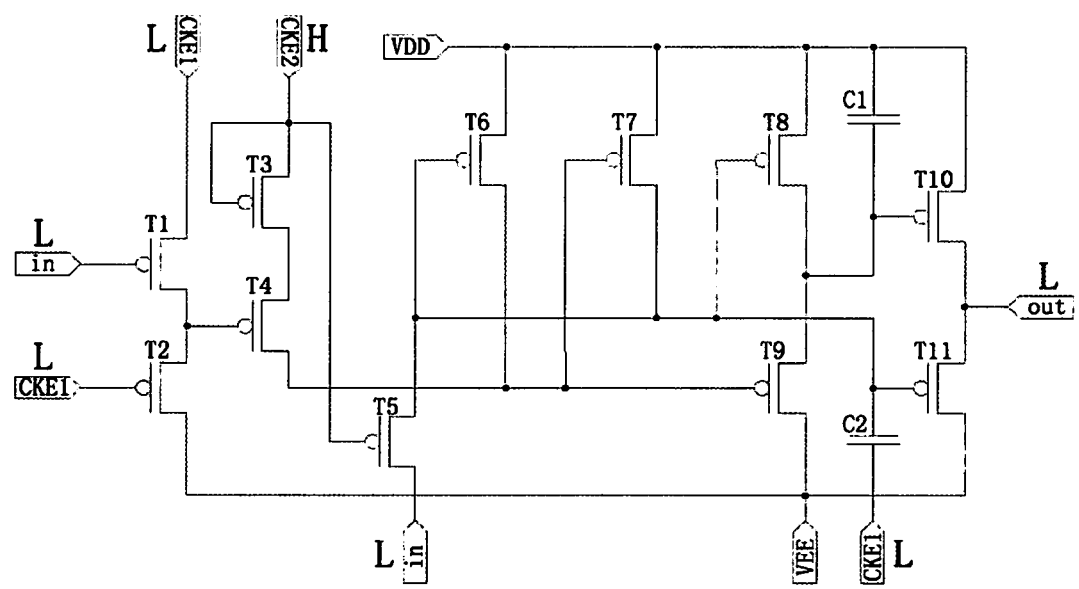
FIG. 9 illustrates a schematic diagram illustrating a circuit-conducted state of the first stage of the transmitting control line driver unit, at a fifth moment, in the transmitting control line driver of the present disclosure, according to the first embodiment of the present disclosure.

As illustrated in FIG. 9, at a fifth moment (corresponding to region "E" of FIG. 10) of the first stage of the transmitting control line driver unit in the transmitting control line driver of the present disclosure, the first input terminal CKE1 is input with a high level, the second input terminal CKE2 is input with a low level, and the third input terminal in is input with a low level. Then, the first PMOS transistor T1 is conducted; the second PMOS transistor T2 is conducted; the third PMOS transistor T3 is cut-off; the fourth PMOS transistor T4 is conducted; the fifth PMOS transistor T5 is cut-off; the sixth PMOS transistor T6 is conducted; the seventh PMOS transistor T7 is cut-off; the eighth PMOS transistor T8 is conducted; the ninth PMOS transistor T9 is cut-off; the tenth PMOS transistor T10 is cut-off; the eleventh PMOS transistor P11 is conducted; and finally, the signal output terminal "out" outputs a low level.

Figure 10:
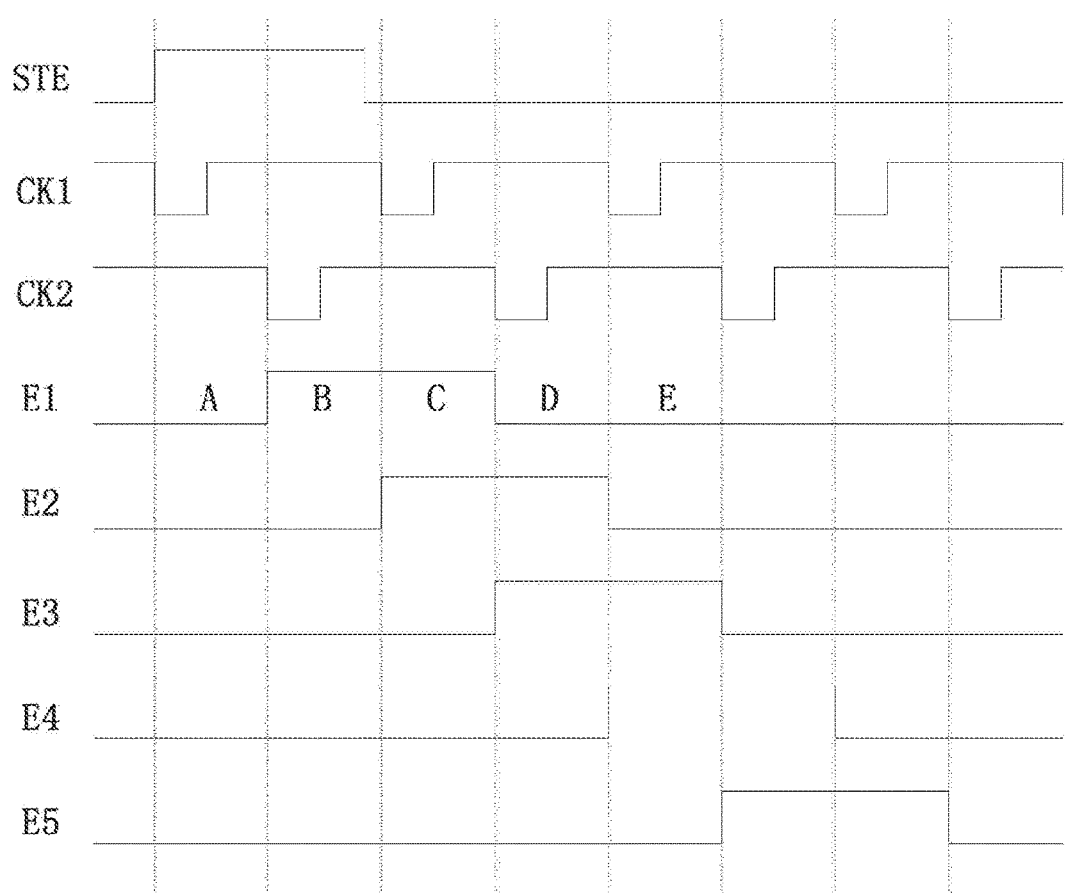
FIG. 10 illustrates input pulse waveform diagrams corresponding to respective stages of transmitting control line driver units in the transmitting control line driver of the present disclosure, according to the first embodiment of the present disclosure.

Furthermore, the states of the first input terminal CKE1, the second input terminal CKE2, the third input terminal "in" and the signal output terminal "out" correlated with the second stage of the transmitting control line driver unit E2 through the fifth stage of the transmitting control line driver unit E5 are illustrated in FIG. 10 (the pulse waveform of the first input terminal CKE1 of the odd number stage of the transmitting control line driver unit is identical with that of the first time sequence signal transmission line CK1, and the pulse waveform of the second input terminal CKE2 of the odd number stage of the transmitting control line driver unit is identical with that of the second time sequence signal transmission line CK2; while the pulse waveform of the first input terminal CKE1 of the even number stage of the transmitting control line driver unit is identical with that of the second time sequence signal transmission line CK2, and the pulse waveform of the second input terminal CKE2 of the even number stage of the transmitting control line driver unit is identical with that of the first time sequence signal transmission line CK1. Signals at each of input terminals and output terminals of the second stage of the transmitting control line driver unit E2 through the fifth stage of the transmitting control line driver unit E5 will not be described in details herein). The second stage of the transmitting control line driver unit E2 through the fifth stage of the transmitting control line driver unit E5 are delayed stage by stage, so as to drive the corresponding transmitting control lines, respectively.

Figure 11:
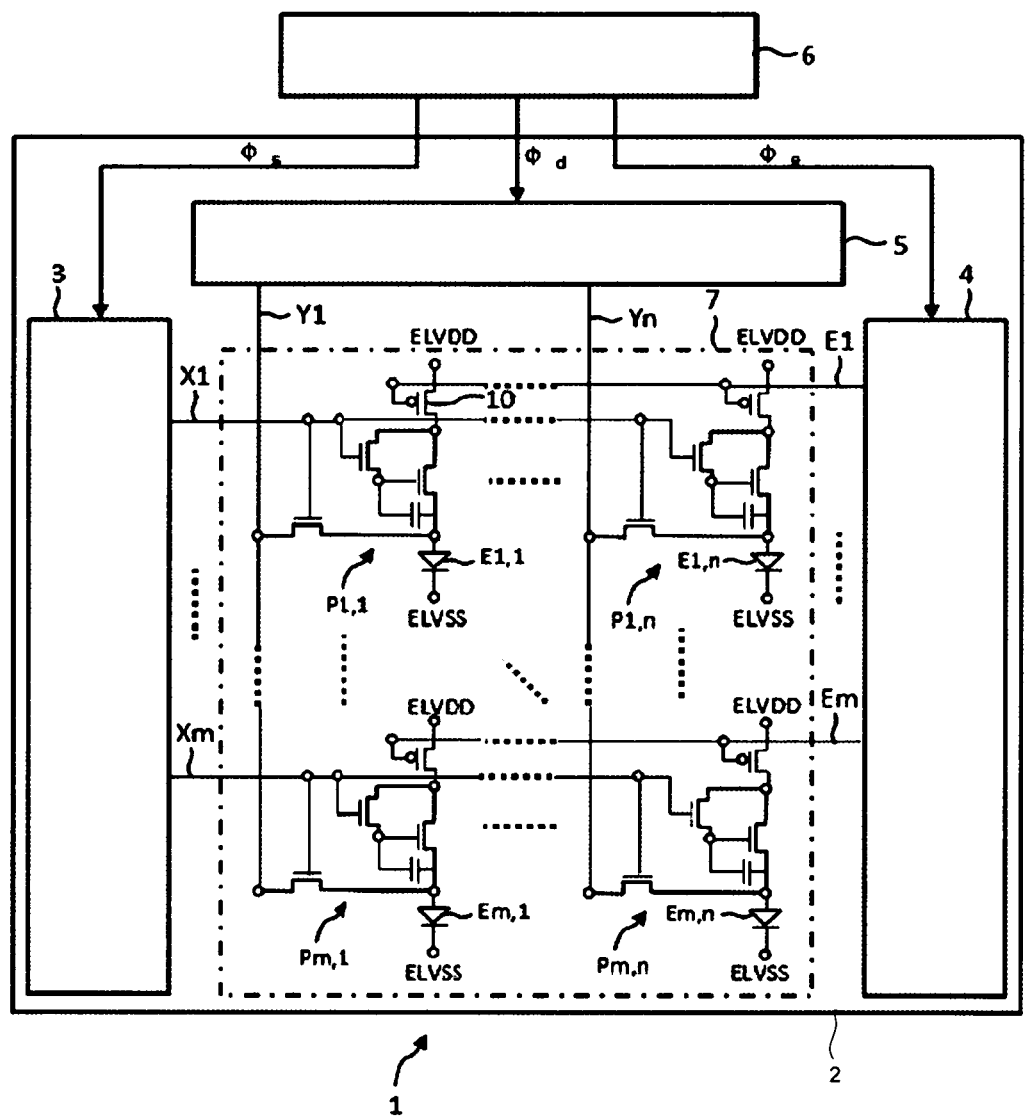
FIG. 11 illustrates a circuit block diagram of an OLED panel of the present disclosure, according to the first embodiment of the present disclosure.

The present disclosure further provides an OLED panel, which includes a signal controller, a data driver, a scan driver, a plurality of OLED pixels and a transmitting control line driver as mentioned above. FIG. 11 illustrates a circuit block diagram of an OLED panel provided by the present disclosure. As illustrated in FIG. 11, as a basic structure, the light-emitting element display 1 includes an active matrix type light-emitting panel 2 and a signal controller 6 for controlling the entire light-emitting element display 1. The light-emitting element display 1 is a so-called active matrix driven type display device. The light-emitting panel 2 includes a transparent substrate made of, for example, borosilicate glass, quartz glass and other glasses which are high-temperature resistant during manufacturing process of transistors. A light-emitting unit 7 is formed on the transparent substrate. The light-emitting unit 7 is provided with a plurality of OLED pixels and is capable of emitting light so as to display images corresponding to image signals from the signal controller 6. The scan driver 3, the transmitting control line driver 4 and the data driver 5 are formed on the transparent substrate to drive the respective OLED pixels of the light-emitting unit 7. The scan driver 3, the transmitting control line driver 4 and the data driver 5 are connected so as to be capable of receiving data and control signal φs, φe and φd from the signal controller 6, respectively. Respective wirings and elements are formed on the transparent substrate to constitute the light-emitting panel 2.

In the light-emitting panel 2, m selective scan lines $X_1, X_2, \ldots, X_m$ are formed to be parallel to each other on the transparent substrate. In addition, m transmitting control lines $E_1, E_2, \ldots, E_m$ are formed on the transparent substrate so as to be arranged alternately with the selective scan lines $X_1, X_2, \ldots, X_m$, respectively. These transmitting control lines $E_1, E_2, \ldots, E_m$ are parallel to and spaced from the selective scan lines $X_1, X_2, \ldots, X_m$. In addition, data lines $Y_1, Y_2, \ldots, Y_n$ are formed on the transparent substrate to be substantially perpendicular to the selective scan lines $X_1, X_2, \ldots, X_m$ and the transmitting control lines $E_1, E_2, \ldots, E_m$. The selective scan lines $X_1, X_2, \ldots, X_m$, the transmitting control lines $E_1, E_2, \ldots, E_m$ and the data lines $Y_1, Y_2, \ldots, Y_n$ are made of at least one low impedance material selected from a group consisted of chromium, chromium alloy, aluminum, aluminum alloy, titanium and titanium alloy. The selective scan lines $X_1, X_2, \ldots, X_m$ and the transmitting control lines $E_1, E_2, \ldots, E_m$ may be formed from a same conductive film by using a patterning process. The data lines $Y_1, Y_2, \ldots, Y_n$ are intersected with the selective scan lines $X_1, X_2, \ldots, X_m$ and the transmitting control lines $E_1, E_2, E_m$. The selective scan lines $X_1, X_2, \ldots, X_m$ and the transmitting control lines $E_1, E_2, \ldots, E_m$ are insulated from the data lines $Y_1, Y_2, \ldots, Y_n$ by using, for example, a gate insulating film or a semi-conductive layer.

A plurality of organic EL elements $E_{ij}$ are arranged on the transparent substrate in a form of matrix. One organic EL element is formed in each of regions enclosed by the data lines $Y_1, Y_2, \ldots, Y_n$ and the selective scan lines $X_1, X_2, \ldots, X_m$. A driving circuit for supplying each of the organic EL elements with predetermined current is formed around each of the organic EL elements. One organic EL element and a driving circuit corresponding to this element constitute one OLED pixel $P_{ij}$ of the light-emitting unit 2. In other words, one organic EL element is formed for each of the OLED pixels (m×n pixels).

As described in the foregoing, in the transmitting control line driver of the OLED panel, the signal output terminal "out" of each stage of the transmitting control line driver unit is coupled to one transmitting control line ($E_1, E_2, \ldots, E_m$), and the signal output terminal "out" of each stage of the transmitting control line driver unit provides a transmitting control signal to the transmitting control line (transmitting control transistor), which will not be repeated here.

The present disclosure further provides a display device, including a signal controller, a data driver, a scan driver, a plurality of OLED pixels and a transmitting control line driver as mentioned above. As described in the foregoing, in the transmitting control line driver of the display device, the signal output terminal "out" of each stage of the transmitting control line driver unit is coupled to one transmitting control line ($E_1, E_2, \ldots, E_m$), and the signal output terminal "out" of each stage of the transmitting control line driver unit provides a transmitting control signal to the transmitting control line (transmitting control transistor), which will not be repeated here.

In summary, by using the transmitting control line driver in the present disclosure, the traditional four driving signals can be reduced to two driving signals, without increasing components or elements. In this way, the same function is achieved by less control signals; with the reduction of the control signal, the area of the circuit diagram can be saved, the area of the integrated circuit and also the number of the combined regions are decreased, the reliability is improved and wider operating spaces for components is allowed.

In the foregoing, particular embodiments of the present disclosure are described. It should be appreciated that the present disclosure is not limited to the above-mentioned specific embodiments. Various modifications and alternations can be made Within the scope defined by the claims by those skilled in the art, which would not depart from the substantive contents of the present disclosure.

What is claimed is:

1. A transmitting control line driver, including multiple stages of transmitting control line driver units, a single-pulse activating signal transmission line, a first time sequence signal transmission line and a second time sequence signal transmission line, wherein, each stage of a transmitting control line driver unit includes:

a first transistor coupled between a first input terminal and a first node, the first transistor having a gate electrode coupled to a third input terminal;

a second transistor coupled between the first node and a first power supply voltage, the second transistor having a gate electrode coupled to the first input terminal;

a third transistor coupled between a second input terminal and a second node, the third transistor having a gate electrode coupled to the second input terminal;

a fourth transistor coupled between the second node and a third node, the fourth transistor having a gate electrode coupled to the first node;

a fifth transistor coupled between a fourth node and the third input terminal, the fifth transistor having a gate electrode coupled to the second input terminal;

a sixth transistor coupled between a second power supply voltage and the third node, the sixth transistor having a gate electrode coupled to the fourth node;

a seventh transistor coupled between the second power supply voltage and the fourth node, the seventh transistor having a gate electrode coupled to the third node;

an eighth transistor coupled between the second power supply voltage and a fifth node, the eighth transistor having a gate electrode coupled to the fourth node;

a ninth transistor coupled between the fifth node and the first power supply voltage, the ninth transistor having a gate electrode coupled to the third node;

a tenth transistor coupled between the second power supply voltage and a signal output terminal, the tenth transistor having a gate electrode coupled to the fifth node;

an eleventh transistor coupled between the signal output terminal and the first power supply voltage, the eleventh transistor having a gate electrode coupled to the fourth node;

a first capacitor coupled between the second power supply voltage and the fifth node; and a second capacitor coupled to the fourth node and the first input terminal, wherein, a signal output terminal of each stage of the transmitting control line driver unit is coupled to a third input terminal of a next stage of the transmitting control line driver unit;

a third input terminal of a first stage of the transmitting control line driver unit is coupled to the single-pulse activating signal transmission line;

the first time sequence signal transmission line is coupled to first input terminals of odd number stages of the transmitting control line driver units and is coupled to second input terminals of even number stages of the transmitting control line driver units;

the second time sequence signal transmission line is coupled to second input terminals of the odd number stages of the transmitting control line driver units and is coupled to first input terminals of the even number stages of the transmitting control line driver units; and the signal output terminal of each stage of the transmitting control line driver unit is coupled to the third input terminal of the next stage of the transmitting control line driver unit.

2. The transmitting control line driver of claim 1, wherein, the first transistor, the second transistor, the third transistor, the fourth transistor, the fifth transistor, the sixth transistor, the seventh transistor, the eighth transistor, the ninth transistor, the tenth transistor, and the eleventh transistor are all PMOS transistors.

3. The transmitting control line driver of claim 2, wherein, the first time sequence signal transmission line is configured to transmit a first clock pulse signal; the second time sequence signal transmission line is configured to transmit a second clock pulse signal; and the first clock pulse signal and the second clock pulse signal are not overlapped with each other.

4. The transmitting control line driver of claim 3, wherein, the second clock pulse signal is a half-period delay signal of the first clock pulse signal.

5. The transmitting control line driver of claim 2, wherein, the third input terminal of the first stage of the transmitting control line driver unit is configured to receive a single-pulse activating signal.

6. The transmitting control line driver of claim 2, wherein, the signal output terminal of each stage of the transmitting control line driver unit is further coupled to a transmitting control line.

7. An OLED panel, including a signal controller, a data driver, a scan driver, a plurality of OLED pixels and the transmitting control line driver according to claim 2.

8. A display device including a signal controller, a data driver, a scan driver, a plurality of OLED pixels and the transmitting control line driver according to claim 2.

9. The transmitting control line driver of claim 1, wherein, the first time sequence signal transmission line is configured to transmit a first clock pulse signal; the second time sequence signal transmission line is configured to transmit a second clock pulse signal; and the first clock pulse signal and the second clock pulse signal are not overlapped with each other.

10. The transmitting control line driver of claim 9, wherein, the second clock pulse signal is a half-period delay signal of the first clock pulse signal.

11. An OLED panel, including a signal controller, a data driver, a scan driver, a plurality of OLED pixels and the transmitting control line driver according to claim 10.

12. A display device including a signal controller, a data driver, a scan driver, a plurality of OLED pixels and the transmitting control line driver according to claim 10.

13. An OLED panel, including a signal controller, a data driver, a scan driver, a plurality of OLED pixels and the transmitting control line driver according to claim 9.

14. A display device including a signal controller, a data driver, a scan driver, a plurality of OLED pixels and the transmitting control line driver according to claim 9.

15. The transmitting control line driver of claim 1, wherein, the third input terminal of the first stage of the transmitting control line driver unit is configured to receive a single-pulse activating signal.

16. An OLED panel, including a signal controller, a data driver, a scan driver, a plurality of OLED pixels and the transmitting control line driver according to claim 15.

17. The transmitting control line driver of claim 1, wherein, the signal output terminal of each stage of the transmitting control line driver unit is further coupled to a transmitting control line.

18. An OLED panel, including a signal controller, a data driver, a scan driver, a plurality of OLED pixels and the transmitting control line driver according to claim 17.

19. An OLED panel, including a signal controller, a data driver, a scan driver, a plurality of OLED pixels and the transmitting control line driver according to claim 1.

20. A display device including a signal controller, a data driver, a scan driver, a plurality of OLED pixels and the transmitting control line driver according to claim 1.

\* \* \* \* \*